(12) United States Patent
Sano

(10) Patent No.: US 6,323,937 B1
(45) Date of Patent: Nov. 27, 2001

(54) PROJECTION EXPOSURE APPARATUS, AND DEVICE MANUFACTURING METHOD USING THE SAME

(75) Inventor: Kazuo Sano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/406,204

(22) Filed: Sep. 28, 1999

(30) Foreign Application Priority Data

Sep. 28, 1998 (JP) .................................................. 10-290029

(51) Int. Cl.⁷ .......................... G03B 27/72; G03B 27/42; G03B 27/54; A61N 5/00; G03F 9/00
(52) U.S. Cl. ............................... 355/69; 355/53; 355/67; 355/77; 250/492.2; 250/492.22; 430/4; 430/5
(58) Field of Search .................... 355/53, 57, 69, 355/77; 250/492.2, 492.22; 430/4, 5

(56) References Cited

U.S. PATENT DOCUMENTS

| 3,823,318 | 7/1974 | Krause ............................ 250/214 P |
| 4,519,692 | 5/1985 | Michalik ............................. 354/412 |
| 4,711,568 | 12/1987 | Torigoe et al. ....................... 355/68 |
| 4,804,978 | 2/1989 | Tracy .................................. 346/108 |
| 4,822,975 | 4/1989 | Torigoe .......................... 219/121.85 |
| 4,884,101 | 11/1989 | Tanimoto ............................. 355/68 |
| 4,947,047 | 8/1990 | Muraki ............................ 250/492.2 |
| 4,970,546 | 11/1990 | Suzuki et al. ......................... 355/53 |
| 4,974,919 | 12/1990 | Muraki et al. ....................... 350/6.6 |
| 5,053,614 | 10/1991 | Yui et al. ............................. 250/205 |
| 5,107,275 | 4/1992 | Tsuruoka et al. ..................... 346/1.1 |
| 5,119,390 | 6/1992 | Ohmori ................................ 372/25 |
| 5,171,965 | 12/1992 | Suzuki et al. ..................... 219/121.6 |
| 5,191,374 | 3/1993 | Hazama et al. ....................... 355/43 |
| 5,250,797 | 10/1993 | Sano et al. .......................... 250/205 |
| 5,475,491 | 12/1995 | Shiozawa ............................ 356/394 |
| 5,491,534 | 2/1996 | Shiozawa ............................. 355/69 |
| 6,078,381 | * 6/2000 | Suzuki ................................. 355/53 |

FOREIGN PATENT DOCUMENTS

| 60-158449 | 8/1985 | (JP) . |
| 7-230949 | 8/1995 | (JP) . |

* cited by examiner

Primary Examiner—Russell Adams
Assistant Examiner—Khaled Brown
(74) Attorney, Agent, or Firm—Fitzpatrick, Cella, Harper & Scinto

(57) ABSTRACT

A projection exposure apparatus for transferring, by projection exposure, a pattern of a first object onto a second object while scanning the first and second objects in synchronism with each other, includes an illumination optical system having a secondary light source forming system for forming a secondary light source and a slit disposed with a space from the first object or a plane conjugate thereto, the illumination optical system being operable to illuminate the first object with light supplied from a light source of a pulse light emission type aid having a slit-like irradiation region defined through the slit on a light path of the illumination optical system, a projection optical system for projecting the pattern of the first object onto the second object, and a control system for controlling an exposure parameter so that an integrated exposure intensity upon the first object and in the scan direction in accordance with a change in size of the secondary light source.

6 Claims, 6 Drawing Sheets

PROJECTION EXPOSURE APPARATUS, AND DEVICE MANUFACTURING METHOD USING THE SAME

FIELD OF THE INVENTION AND RELATED ART

This invention relates to a projection exposure apparatus and a device manufacturing method, in which a pattern of a first object such as a mask or a reticle is imaged on and transferred to a second object such as a photosensitive substrate or a wafer, for example. The present invention is suitably usable in a lithographic process for manufacture of various devices such as a semiconductor device (e.g., IC or LSI), an image pickup device (e.g., CCD), a liquid crystal panel or a magnetic head, for example.

The integration of a semiconductor device such as IC or LSI has increased more and more, and a microprocessing technique for the semiconductor device has advanced greatly. As regards a projection exposure apparatus which is the main part of the microprocessing technique, there are (i) a unit magnification exposure apparatus (mirror projection aligner) wherein, by using a mirror optical system of unit magnification having an arcuate shape exposure region, a mask and a photosensitive substrate are exposed in a single exposure operation while they are scanned simultaneously, and (ii) a reduction projection exposure apparatus (stepper) wherein, by using a dioptric system, an image of a mask pattern is formed on a photosensitive substrate and the photosensitive substrate is exposed in a step-and-repeat method.

In these projection exposure apparatuses, the stepper has an advantage over the mirror projection aligner in the point of resolving power and registration precision. Recently, a step-and-scan type (scanning) projection exposure has been proposed, by which a high resolving power is attainable while, on the other hand, the picture plane size can be enlarged.

A step-and-scan type exposure apparatus has a slit-like exposure region, and, in regard to each shot, a scanning exposure (scan of the slit) is performed AS the scanning exposure of one shot is completed, the wafer is moved to a subsequent-shot exposure position, and the scanning exposure of the subsequent shot is initiated. In this manner, the stepwise motion to a subsequent shot and the scan for exposure of that shot are repeated, by which the exposure of the whole wafer is accomplished.

In projection exposure apparatuses, improvements of resolution have been attempted to attain formation of a pattern image of a size of 0.5 micron or smaller. Specifically, enlargement of the numerical aperture (NA) of a projection lens or shortening of the wavelength of exposure light have been proposed. Generally, as the exposure wavelength is shortened, the transmission factor of a glass material decreases, and only a few types of glass materials can be used in a projection exposure apparatus. As the types of glass materials are limited, the correction of chromatic aberration of the projection optical system becomes difficult to attain, so that the bandwidth of exposure light has to be narrowed to a level with which the influence of chromatic aberration can be disregarded. For example, in a projection optical system to be used with light of a wavelength region of 300 nm or less, usable glass materials are only quartz and fluorite. Thus, generally a laser is used as an exposure light source. In lasers of such type, an excimer laser has a very high energy so that a high throughput can be expected. Therefore, it is widely used as a short-wavelength light source in a projection exposure apparatus.

Since excimer lasers are pulse lasers, use of an excimer laser in a projection exposure apparatus as a light source involves some problems. Particularly, in a mirror projection aligner or a scan type projection exposure apparatus such as a step-and-scan type exposure apparatus, there is a possibility that, depending on the scan speed or the pulse light emission timing, exposure non-uniformness is produced upon a mask surface or a wafer surface. Japanese Laid-Open Patent Application, Laid-Open No. 158449/1985 shows a projection exposure apparatus wherein such exposure non-uniformness due to the pulse light emission can be reduced. More specifically, the light intensity distribution to be produced upon a surface/to be illuminated, with respect to a scan direction, is made substantially into an isosceles triangle or trapezoid shape, by which the synchronization precision for the scan speed and the pulse light emission is loosened. The control for making the light intensity distribution in the scan direction into a desired shape, is attained by inserting a light attenuating element such as an ND filter into the light path of an illumination system. The shape of the light intensity distribution is not limited to an Isosceles triangle or trapezoid. Any shape may be used, provided that the dispersion of exposure amount when distributions are superposed is small.

Japanese Laid-Open Patent Application, Laid-Open No. 230949/1995 shows an improved projection exposure apparatus wherein, in a plane which contains a scan direction of a surface to be illuminated and an optical axis of an illumination optical system, chief rays of the flux of illumination light are collected at a position spaced by a predetermined distance from the surface to be illuminated, along the optical axis direction. such that a tilt region due to blur is produced in the light upon the surface illuminated By making the light intensity distribution in the tilt region into a desired shape, an illumination system and a projection exposure apparatus having the same, with which the decrease of illumination efficiency is prevented while the non-uniformness of exposure amount is reduced, are accomplished. In accordance with this proposal, in a projection exposure apparatus, the shape of the light intensity distribution in the scan direction and upon the surface to be illuminated, can be determined so that the dispersion of integrated exposure amount attributable to unevenness of scan speed or variation in timing of pulse light emission is reduced to minimum.

However, generally, a projection exposure apparatus is used in various illumination conditions. If the illumination condition changes, for example, when an effective light flux is restricted, the shape of the tilt region changes which may cause reduction in width of blur and the uniformness of integrated exposure amount upon the surface being illuminated may be degraded.

FIG. 1 illustrates exposure non-uniformness, in scan exposure using a pulse emission type laser light source, to be produced in a scan direction where the light intensity distribution in the scan direction is improper. The axis of ordinate denotes the light intensity, and the axis of abscissa denotes the position coordinates in the scan direction. Because of pulse emission, the exposure is discrete. Light intensity distributions produced by respective pulses are superposed with a shift, by which the whole light intensity distribution (integrated exposure amount distribution) is produced. If the relationship between the shift amount and the light intensity distribution is not proper, there may occur periodic exposure unevenness such as shown in FIG. 1.

FIG. 2 shows a case where the relation between the shift amount and the light intensity distribution is proper. It is seen that the integrated exposure amount is kept uniform.

SUMMARY OF THE INVENTION

It is an object of the present invention to provide an improved projection exposure apparatus and/or a device exposure method using the same, by which, in scanning exposure using a laser light source of pulse emission type, for example, the light intensity distribution in a scan direction, upon a surface to be illuminated, can be made into a desired shape regardless of the size and/or the shape of light upon a secondary light source plans, such that a uniform integrated exposure amount distribution can be produced.

Here, the secondary light source refers to an effectual size of a light source image to be formed for illumination of an article to be illuminated. For example, it may be a light source image formed at a light exit surface of an optical integrator included in an illumination system, or a stop which serves to determine the size of the light source image as a whole.

In accordance with an aspect of the present invention, there is provided a projection exposure apparatus for transferring, by projection exposure, a pattern of a first object onto a second object while scanning the first and second objects in synchronism with each other, said apparatus comprising: an illumination optical system having secondary light source forming means for forming a secondary light source and a slit disposed with a space from the first object or a plane conjugate thereto, said illumination optical system being operable to illuminate the first object with light supplied from a light source of a pulse light emission type and having a slit-like irradiation region defined through said slit on a light path of said illumination optical system; a projection optical system for projecting the pattern of the first object onto the second object; and control means, wherein, when R is an effective radius of the secondary light source, d is an optical distance from the slit to the first object or the conjugate plane thereof, f is a focal length of an optical member disposed between the secondary light source and the slit, F is a pulse emission frequency of the light source, and V is a scan speed of the first object in the scan exposure, said control means is operable to make uniform an integrated exposure intensity upon the first object and in the scan direction in accordance with a change in any parameter of R, d, f, F and V, by changing at least one of the remaining parameters.

In accordance with another aspect of the present invention, there is provided a projection exposure apparatus for transferring, by projection exposure, a pattern of a first object onto a second object while scanning the first and second objects in synchronism with each other, said apparatus comprising: an illumination optical system having secondary light source forming means for forming a secondary light source and a slit disposed with a space from the first object or a plane conjugate thereto, said illumination optical system being operable to illuminate the first object with light supplied from a light source of a pulse light emission type and having a slit-like irradiation region defined through said slit on a light path of said illumination optical system; a projection optical system for projecting the pattern of the first object onto the second object; and control means for controlling an exposure parameter so that an integrated exposure intensity upon the first object and in the scan direction in accordance with a change in size of the secondary light source.

In accordance with a further aspect of the present invention, there is provided a device manufacturing method, comprising the steps of: transferring, by projection exposure, a pattern of a first object onto a second object with use of a projection exposure apparatus such as above, while scanning the first and second objects in synchronism with each other; and developing the second object having the pattern transferred thereto.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
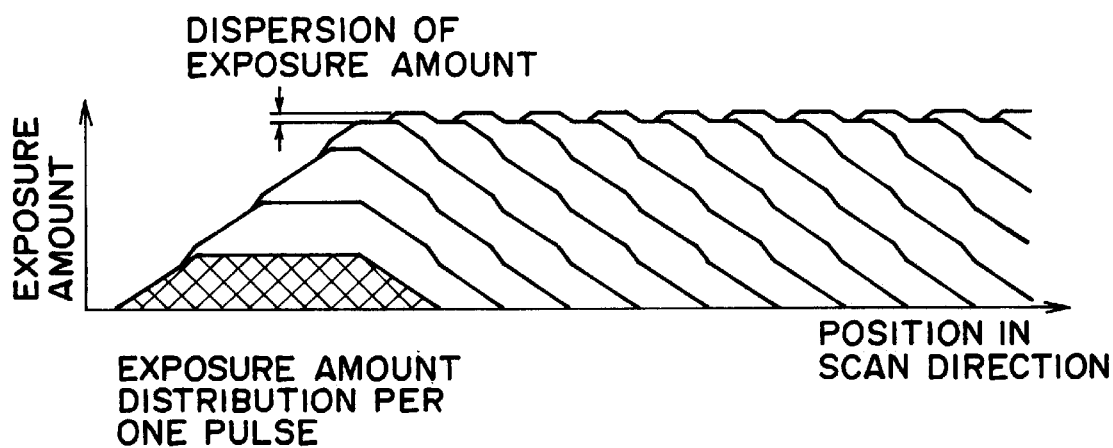
FIG. 1 is a schematic view for explaining non-uniformness of integrated exposure amount to be produced in scanning exposure, using a pulse light source.
Figure 2:
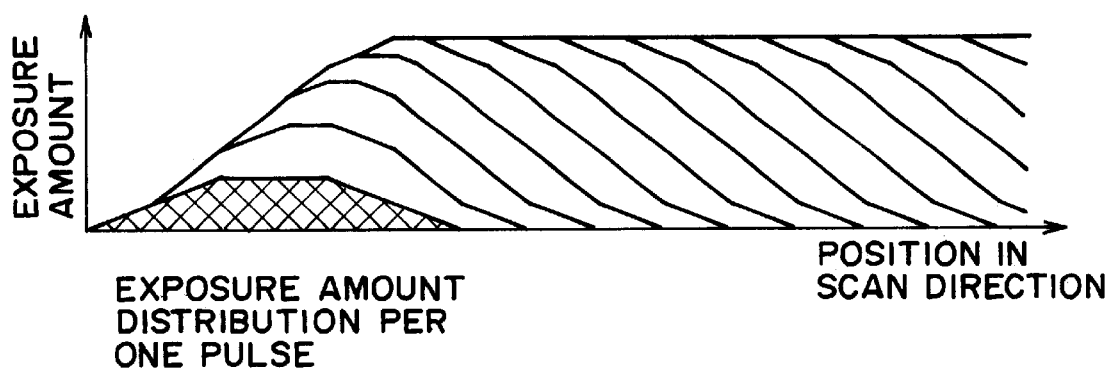
FIG. 2 is a schematic view for explaining a result without non-uniformness of integrated exposure amount in scanning exposure, using a pulse light source.
Figure 3:
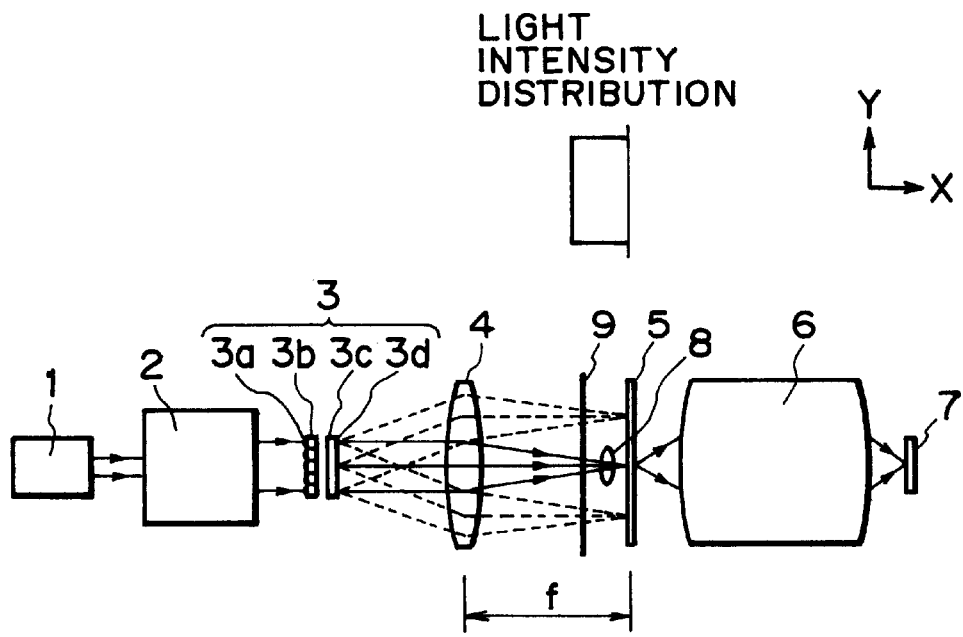
FIG. 3 is a schematic view of a main portion of a first embodiment of the present invention, in a section along an X-Y plane.
Figure 4:
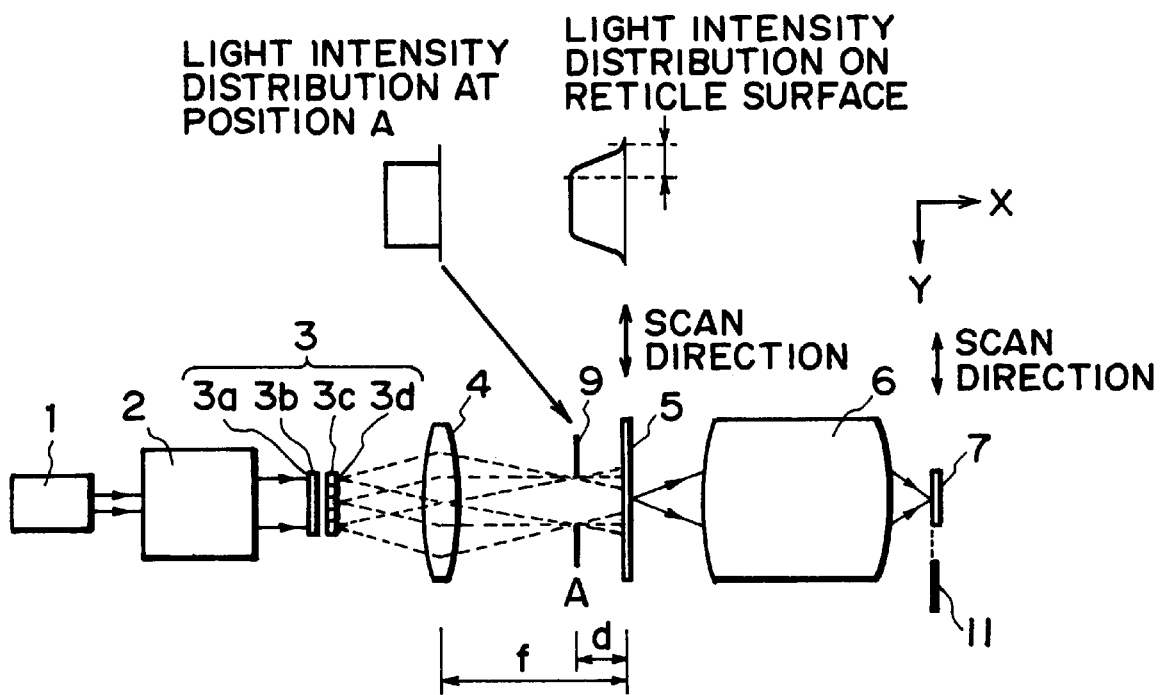
FIG. 4 is a schematic view of a main portion of the first embodiment of the present invention, in a section along a Z-X plane.

FIGS. 3 and 4 are schematic views, respectively, of a main portion of a projection exposure apparatus according to a first embodiment of the present invention, in sections along an X-Y plane and a Z-X plane, respectively. In these drawings, the optical arrangement is illustrated along a straight line from a light source, wherein the optical axis direction of the optical system is taken on an X axis while the scan direction of a mask and a photosensitive substrate (wafer) is taken on a Z axis. Thus, what FIG. 4 illustrates corresponds to the optical arrangement of FIG. 3 as viewed in the Y direction contained in the sheet of the drawing of FIG. 3, and the optical arrangement In the scan direction is shown there.

In FIGS. 3 and 4, denoted at 1 is a laser light source which may comprise a band-narrowed excimer laser of pulse emission type. Approximately parallel light emitted from the laser light source 1 enters an incoherency transformation means 2 for transforming a received light into an incoherent light. The incoherency transformation means 2 has a function of incoherency transformation such as dividing or scanning the laser light so as to prevent production of an interference fringe or a speckle pattern on the surface of a wafer 7, as well as a beam shaping function for transforming the shape of the light from the laser light source to be mated with the shape of an optical integrator 3.

The light from the incoherency transformation means 2 impinges on the light entrance surface 3a of the optical integrator 3. The optical integrator 3 comprises two, that is, first and second cylindrical lens groups. The first cylindrical lens group includes cylindrical lenses 3b having a refracting power only in the X-Y plane and being disposed in array along the Y-axis direction, with a predetermined pitch. The second cylindrical lens group, following the first group in series, includes cylindrical lenses 3c having a refracting power only in the X-Z plane and being disposed in array along the Y-axis direction, with a predetermined pitch. These two cylindrical lens groups are set so that their refracting powers in two orthogonal directions function to accomplish a desired light intensity distribution upon the surface of a reticle 5. The optical integrator 3 has a light exit surface 3d which provides a secondary light source plane, and plural divergent lights emerge from the light exit surface 3d and enter a condenser optical system 4.

The condenser optical system 4 has different refractive indices along the X-Y sectional plane of FIG. 3 and the X-Z sectional plane of FIG. 4. respectively.

The condenser optical system 4 functions to collect light beams from the light exit surface 3d of the optical integrator 3 and to illuminate a reticle (mask) 5 having a pattern formed thereon, through a slit opening of a slit 9 which is a light blocking member with a slit-like opening. Denoted at 6 is a projection optical system for projecting a circuit pattern of a semiconductor device as formed on the reticle 5 onto the surface of a wafer (photosensitive substrate) 7, whereby a projected image of the circuit pattern is formed there. Here, by means of the condenser optical system 4, the light exit surface 3d of the optical integrator 3 and the pupil plane of the projection optical system 6 are placed substantially in an optically conjugate relation with each other.

In the X-Y sectional plane of FIG. 3, the light rays from the respective points on the light exit surface 3d (i.e., secondary light sources) of the optical integrator 3 are superposed one upon another on the reticle 5 surface.

Also, in the X-Z sectional plane of FIG. 4, the light rays from the respective points on the light exit surface 3d of the optical integrator 3 are superposed one upon another on the surface of the slit 9 disposed at a position spaced from the reticle 5.

In this embodiment, the image projection and transfer is performed by moving the reticle 5 and the wafer 7 along the scan direction, as depicted by arrows, while maintaining a predetermined relation between them.

Denoted at 8 and illustrated by solid lines in FIG. 3 are chief rays of the lights emitted from the respective points on the light exit surface 3d of the optical integrator 3 These chief rays are parallel with each other as they are just emitted from the light exit surface 3d, and then they are collected by the condenser optical system 4 toward the center of the reticle 5, through the slit 9 Also, those light rays having certain angles with respect to the chief ray are collected to other points. Thus, the light intensity distribution on the reticle 5 surface in the Y-axis direction has an approximately flat and rectangular shape such as shown in FIG. 3.

As compared therewith, in the Z-X sectional plane of FIG. 4, the chief rays 8b of lights emitted from the optical integrator 3 are collected by the condenser optical system 4 on the slit 9. The slit 9 is provided at a position A which is spaced by a predetermined distance d from the reticle 5 along the optical axis direction. For the reason the same as in the structure of FIG. 3, the light intensity distribution at the position A of the aperture of the slit 9 along the Z-axis direction is substantially uniform. Because of the effect of defocus that the reticle 5 is spaced by the predetermined distance d from the position A. the light intensity distribution upon the reticle 5 surface in the Z-axis direction hat a shape like an isosceles trapezoid shape with an approximately flat central portion and slants at the peripheral portion. This shape is advantageous since, even if there occurs a change in scan speed or a shift of pulse emission timing with respect to the scan exposure, the non-uniformness of integrated exposure amount can be suppressed small. The shape of light intensity distribution with which the non-uniformness of integrated exposure amount can be minimized, can be determined in accordance with the pulse emission frequency and the scan speed.

In FIG. 4, it is assumed that d is the distance between the position A and the reticle 5, f is the focal length of the condenser optical system 4 in the X-Z section, R is the effective radius of the secondary light source, F is the pulse emission frequency of the laser light source, and V is the scan speed of the reticle 5. As regards the condition for maintaining the uniformness of the integrated exposure amount, it has been found that the width (2dR/f) of the slant region of the light intensity distribution in the scan direction is equal to a multiple, by an integral number, of the pulse light spacing, and that it can be expressed by the following equation:

$$2dR/f = nV/F \text{(where n is an integer)} \quad (1)$$

Figure 5A:
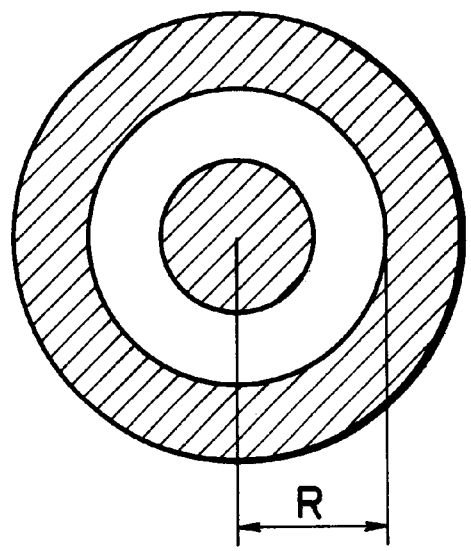
FIGS. 5A–5C are schematic views for explaining examples of an aperture shape of a stop usable in the present invention.
Figure 5B:
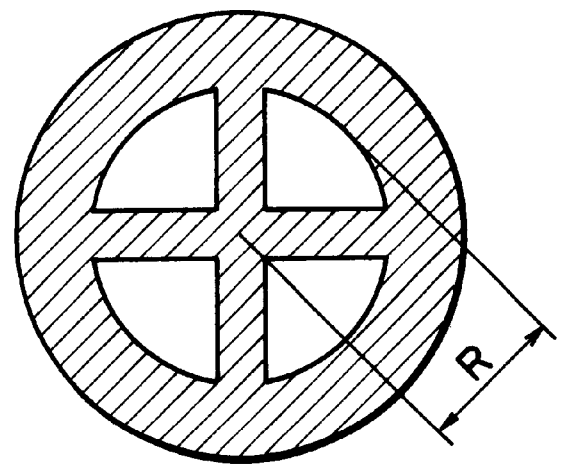
Figure 5C:
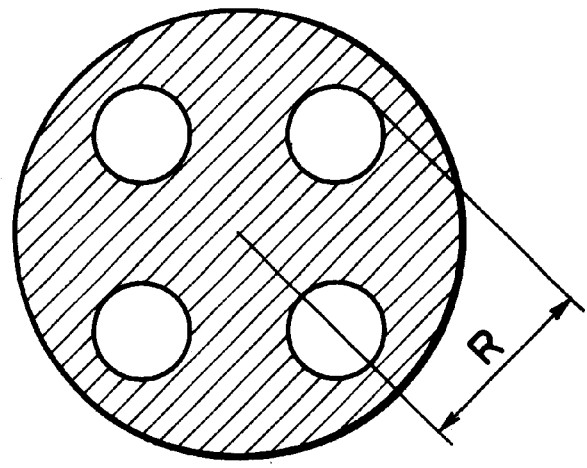

The effective radius R of the secondary light source is determined by the aperture shape of a stop which is disposed at the position of the secondary light source surface 3d The aperture shape of the stop may not only be a circular opening but also be those such as shown in FIGS. 5A–5C. In those cases, the effective radius R of the secondary light source may be defined by the distance to the outermost of the aperture as illustrated.

In practical exposures, however, it is necessary to change the effective radius R of the secondary light source in accordance with a circuit pattern of a reticle 5 to be used. This change may cause a problem of variation in defocus effect, that is, variation in the width of the slant region. The effective radius can be changed by using changing means (not shown) for changing the diameter of the stop disposed at the position of the secondary light source surface 3d.

In this embodiment, when the effective radius of the secondary light source is changed, in order to satisfy the integrated exposure amount uniforming condition (1) described above, a light intensity distribution of an isosceles trapezoid shape, in the scan direction, is produced upon the reticle 5 surface due to the defocus while, on the other hand, any one of the distance d, the emission frequency F, the scan speed V and the focal length f is adjusted in accordance with a change in the parameter R which represents the effective diameter of the secondary light source.

For example, in a case where a light intensity distribution of an Isosceles trapezoid shape is to be produced on the reticle 5 surface in accordance with this embodiment by using a distance d corresponding to the defocus amount, the value of distance d may be adjusted by means of a driving mechanism (not shown) for moving the slit 9 in the optical axis direction, such that the slit 9 can be placed at a position spaced from the reticle 5 in the optical axis direction by d:

$$d = nVf/(2FR) \quad (2)$$

Namely, the distance d from the reticle 5 to the position A of the slit 9 may be adjusted in accordance with the effective radius of the secondary light source, on the basis of equation (2) above, by which the light intensity distribution on the reticle 5 surface can be controlled into a desired shape. For example, when the light emitted from the secondary light source surface 3d is restricted by a stop, that is, if the effective radius R is made smaller, the value of the distance d may be enlarged in accordance with equation (2). Thus, the position control may be made so that the position A of the slit 9 is spaced more away from the reticle 5. This is because there is an inverse proportional relation between the distance d and the effective radius R, as in equation (2). With the control described above, the light intensity distribution on the reticle 5 can be kept uniform regardless of a change in the secondary light source.

If on the other hand the distance d is to be held fixed, the pulse emission frequency F of the laser light source 1 may be adjusted:

$$F=nVf/(2dR) \qquad (3)$$

Alternatively, the scan speed V of the reticle 5 may be adjusted:

$$V=2dFR/(nf) \qquad (4)$$

As a further alternative, the focal length f of the condenser optical system 4 may be adjusted:

$$f=2dFR/(nV) \qquad (5)$$

Also, any combination of the elements d, F, V and f, as desired, may be adjusted to satisfy equation (1). All the parameters for calculating equation (1) are known values in the projection exposure apparatus, the coordination of the values of elements d, F, V and f can be calculated easily.

In this embodiment, there is a function for measuring the light intensity distribution on the same plane as the wafer 7 surface, in the scan direction, and a measured value is fed back. An illuminance sensor 11 provided on the same plane as the wafer 7 surface comprises sensor elements disposed along the scan direction, with small intervals in one-dimensional direction. By moving the sensor 11 to the exposure position of the projection optical system, the light intensity distribution in the scan direction can be measured. On the basis of the measurement, the width 2dR/f of the slant region in the scan direction can be detected directly. Therefore, the distance d or the value of F or V can be corrected in on-line manner, so that the width becomes equal to nV/F. The measurement of the slant region by using the illuminance sensor having elements disposed with small intervals, may be replaced by a combination of a small aperture and a light quantity sensor wherein the distribution can be measured while moving the small aperture at the exposure position.

For example, if the correction is to be done on the basis of the distance d, an initial value can be determined in accordance with equation (2). However, there are various error factors in practice, the light intensity distribution in the scan direction may be measured directly, and the result may be fed back. Then, a difference with respect to a desired light intensity distribution having been determined, is corrected by fine adjustment. By this, the uniformness of the integrated exposure amount in the scan direction can be improved. If, as a result of measurement, the width of the slant region of the light intensity distribution of an isosceles trapezoid shape is short as compared with a desired value, the position of the slit 9 is shifted minutely so that it becomes more remote from the reticle 5 (i.e., distance d is enlarged). If, on the other hand, the width of the slant region is too large, the position of the slit 9 is changed by fine adjustment so that it becomes closer to the reticle 5 (i.e., distance d is reduced). The width of the slant region can be adjusted by changing the focal distance f of the condenser optical system 4, in place of changing the distance d.

A similar adjustment can be done by adjusting the laser emission frequency F or the value of scan speed V. In that occasion, however, the width of the slant region is unchanged.

In a projection exposure apparatus according to this embodiment of the present invention. as described above, in accordance with a change in radius R of the light emitted from the light exit surface 3d of the optical integrator 3 which is the secondary light source, or alternatively, regardless of a change in the illumination condition, the slit 9 is set at the position A which is spaced by a distance d from the reticle 5 surface in the optical axis direction. Alternatively, the values of the laser emission frequency F, the scan speed V, and the focal length f of the condenser optical system 4 are controlled so that a predetermined relation as given by equation (1) is satisfied among them. By this, the light intensity distribution on the reticle 5 surface along the scan direction can be maintained in an optimum shape, such that the uniformness of exposure amount can be held constantly even when the scan exposure is performed in various illumination conditions.

As regards the lengthwise direction (Y direction) of the slit 9 orthogonally intersecting the scan direction, it is disposed so that the chief rays 8 of the lights emitted from the optical integrator 3 are collected upon the reticle 5. Therefore, the light intensity distribution is substantially uniform The optical arrangement in relation to the scan direction (Z direction) and the lengthwise direction (Y direction) of the slit 9 as described above accomplishes a desired light intensity distribution with respect to both of these directions without excessive eclipse (interception) of light. Thus, the illumination efficiency is high, and also the exposure non-uniformness in both of these directions can be made small.

The slit 9 of the first embodiment for adjusting the irradiation range in the scan direction has a function for adjusting the aperture width in the Z-axis direction (scan direction), at an arbitrary position in the Y-axis direction. In a case where the light intensity at an arbitrary position in the Y-axis direction, being integrated in the Z-axis direction, is large as compared with other positions, the aperture width in Z direction may be narrowed. If it is small, the aperture width may be widened. Since the light intensity distribution in the Y-axis direction is kept substantially uniform by means of the optical integrator 3 and the condenser optical system 4, the uniformness of integrated exposure amount in the Y-axis direction in the scan exposure can be further improved through the adjustment of the aperture width in the Z-axis direction at respective positions of the slit 9 in the Y-axis direction In this embodiment, by use of a scan type projection exposure apparatus using pulse light, a pattern formed on the reticle 5 surface is transferred, by projection exposure, onto regions on the wafer 7 surface sequentially. The thus exposed wafer is then processed by a development step, known in the art, and semiconductor devices are produced.

Figure 6:
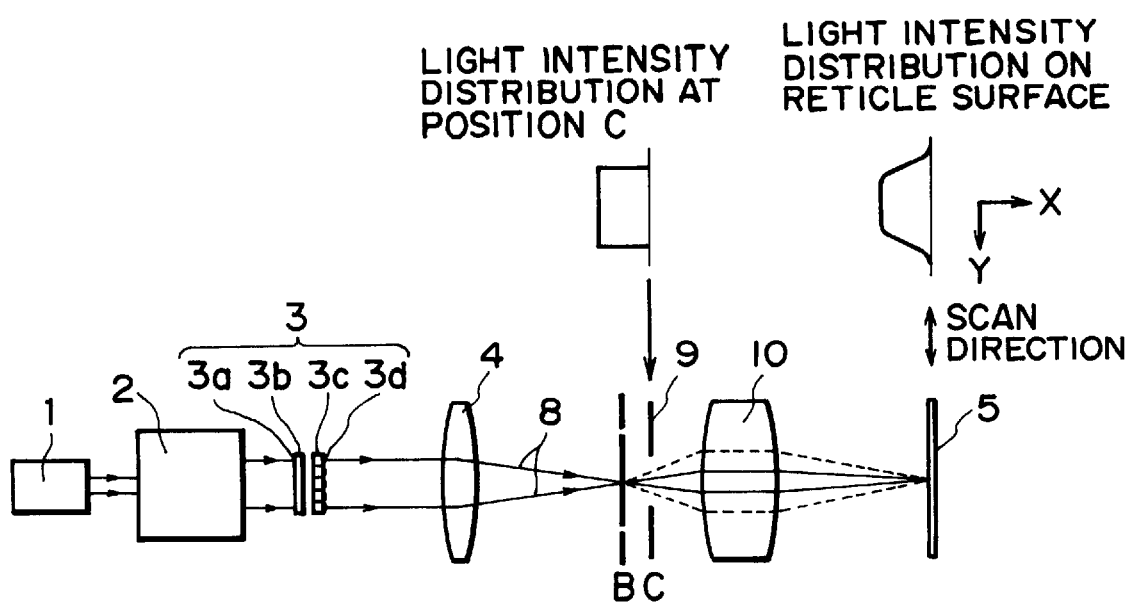
FIG. 6 is a schematic view of a main portion of a second embodiment of the present invention, in a section along a Z-X plane.

FIG. 6 is a schematic view of a main portion of a second embodiment of the present invention, along a Z-X plane. The coordinates are similar to those of the first embodiment, and the optical axis direction lies on an X axis, while the can direction lies on a Z axis. Like numerals as those of the first embodiment are assigned to corresponding elements.

In this embodiment, as compared with the first embodiment of FIG. 4, a relay lens 10 is disposed between the condenser lens 4 and the reticle 5. The remaining portion has a similar structure. In FIG. 6, the optical arrangement after the reticle 5, including the projection optical system 6 and the water 7, is similar to that of the first embodiment, and they are not illustrated in the drawing.

In FIG. 6, the position B is the position where the chief rays 8 emitted from the optical integrator 3 are collected by the condenser optical system 4. The relay lens 10 functions, as depicted by broken lines, to project an image of the position B upon a position on the reticle 5 with a predetermined magnification.

On the other hand, the position C is the position where the slit 9 is disposed, and it is spaced by a predetermined distance from the position B in the X direction (optical axis direction), wherein the position B is optically conjugate with the reticle 5. By setting the slit 9 at a position spaced from the conjugate position as described, the light intensity distribution in the scan direction can be made into an isosceles trapezoid shape. When viewed from the reticle side, the slit 9 can be regarded as being disposed at a position optically spaced from the reticle 5.

In the second embodiment, as in the first embodiment, the distance between the position B and the position C, the emission frequency F of the laser light source 1, the scan speed V of the reticle 5 are adjusted, singly or in combination, by which the uniformness of the integrated exposure amount on the reticle 5 surface can be maintained regardless of various changes in the illumination condition.

Further, in the second embodiment, as in the first embodiment, the distance between the position B and the position C, the emission frequency of the laser light source 1, the Scan speed V of the reticle 5 can be adjusted singly or in combination, on the basis of a measured value of an illuminance sensor (not shown) disposed on the same plane as the wafer surface, by which a desired light intensity distribution can be accomplished in the scan direction. Thus, regardless of a change in diameter of the light emitted from the secondary light source surface 3d due to a change in illumination condition, the uniformness of the integrated exposure amount on the reticle 5 surface in the scan exposure can be held.

The light intensity distributions at the reticle 5 position, the position B and the position C, with respect to the scan direction, have shapes such as shown in FIG. 6. Further, while in the first embodiment the slit 9 position is placed between the reticle 5 and the illumination system 4, the slit 9 for restricting the irradiation range in the scan direction may be disposed optically on the reticle 5 side of the light convergence position B of the illumination optical system 4 as in this embodiment. Also with this structure, the light intensity distribution on the reticle 5 surface in the scan direction can be maintained in a desired shape.

Next, an embodiment of a semiconductor device manufacturing method which uses a projection exposure apparatus according to any one of the preceding embodiments, will be explained.

Figure 7:
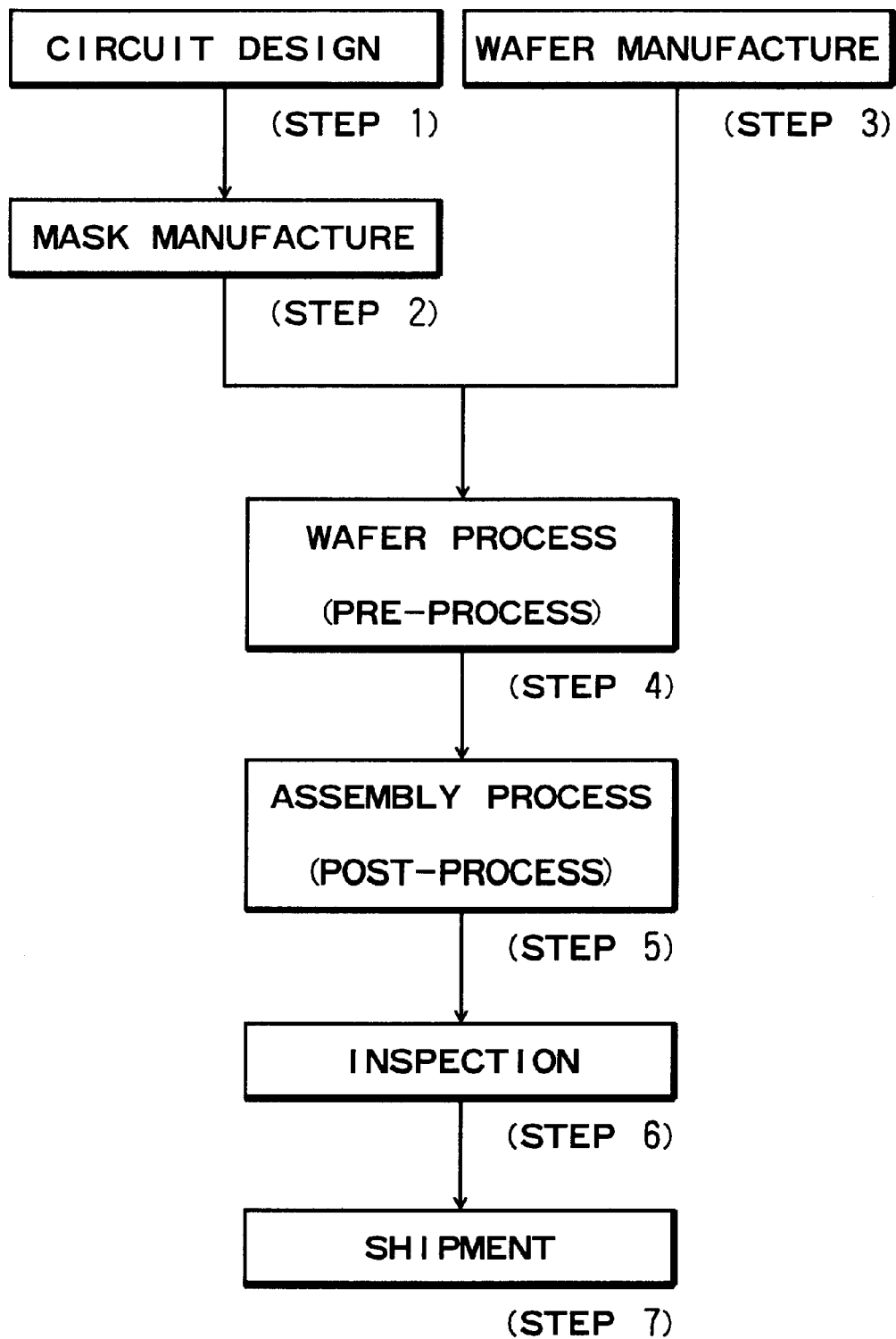
FIG. 7 is a flow chart of device manufacturing processes according to an embodiment of the present invention.

FIG. 7 is a flow chart of procedure for manufacture of microdevices such as semiconductor chips (e.g. ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 8:
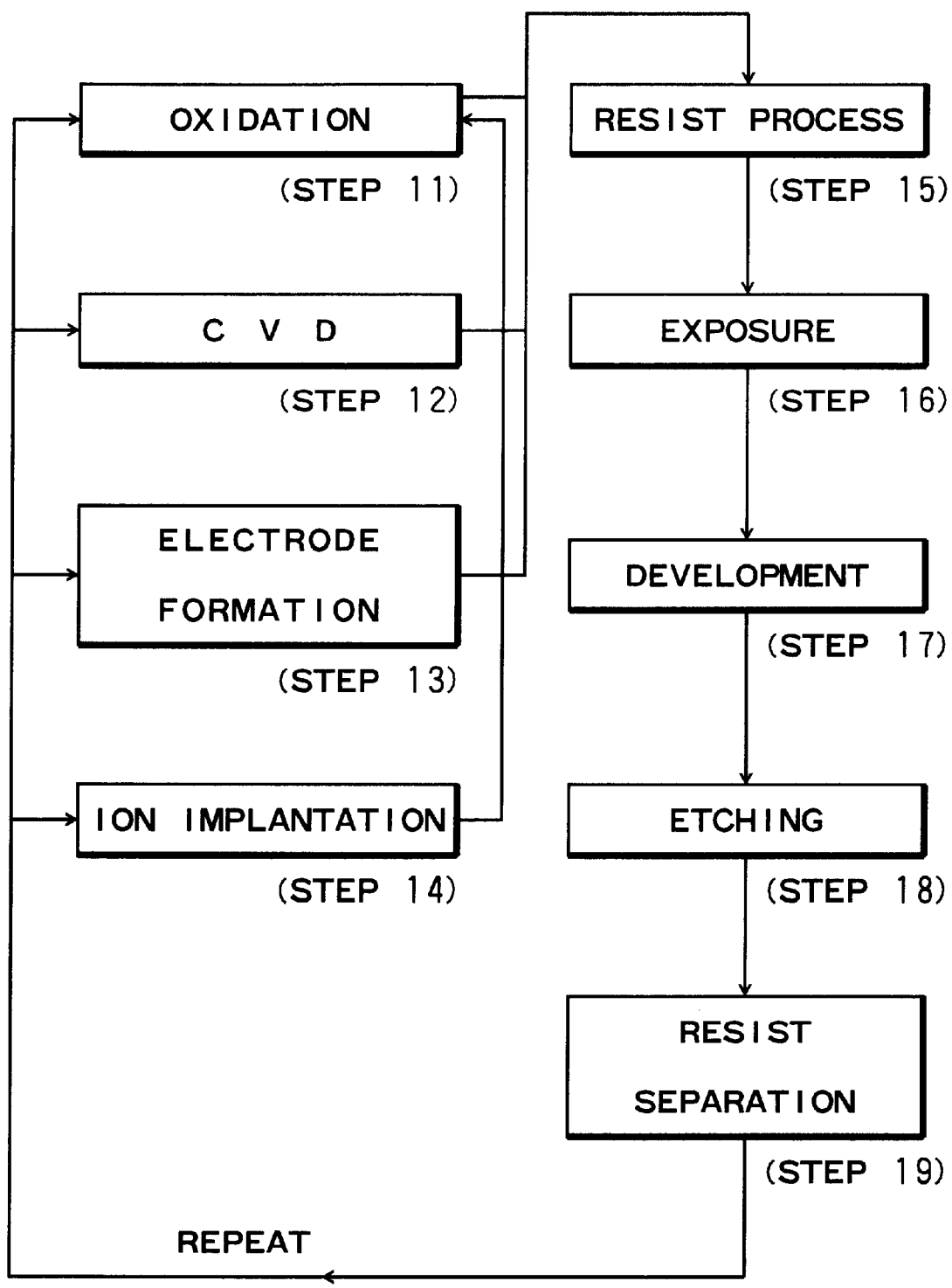
FIG. 8 is a flow chart of a wafer process in the procedure of FIG. 7.

FIG. 8 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for. separating the resist material remaining on the water after being subjected to the etching process. By repeating these processes, circuit patterns are superposedly formed on the wafer.

In accordance with the embodiments of the present invention as described hereinbefore, in a projection exposure apparatus, in accordance with a change in effective radius R of chief rays emitted from secondary light sources of an illumination optical system caused by a change in illumination condition of the projection exposure apparatus, three parameters of the distance of a slit of the illumination optical system in the optical axis direction, the laser emission frequency, and the scan speed are adjusted singly or in combination to thereby satisfy a predetermined relationship by which the light intensity distribution on the reticle surface in the scan direction can be maintained in an optimum shape. By this, the uniformness of exposure amount as the scan exposure is performed in various illumination condition can be held unchanged. An actual intensity distribution may be measured, and its result may be reflected to any one of or any combination of the three adjusting parameters. This accomplishes a projection exposure method and a projection exposure apparatus of higher precision.

Further, the uniformness of an image to be produced upon the surface of a wafer is improved further, such that a higher precision device can be produced.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus for transferring, by projection exposure using a plurality of pulse lights, a pattern of a first object onto a second object while moving the first and second objects in a scan direction, said apparatus comprising:

a light source for producing pulse light;

a secondary light source defined by use of the pulse light from said light source; and a slit disposed away from the first object or a plane being conjugate therewith, wherein the pulse light from said secondary light source passes through said slit and is projected onto the first object, by which a light intensity distribution of a trapezoidal shape with respect to the scan direction is produced on the first object, wherein, when R is an effective radius of the secondary light source, d is an optical distance from the slit to the first object or the plane conjugate therewith, f is a focal length of an optical member for projecting the pulse light from the secondary light source toward the slit, F is a pulse emission frequency of the light source, and V is a movement speed of the first object in the scan direction during the scan exposure thereof, at least one of the optical distance d, the focal length f, the emission frequency F, and the movement speed V is changed in accordance with a change in the effective radius R, so as to make uniform an integrated exposure amount distribution to be provided by plural pulse lights.

2. An apparatus according to claim 1, wherein at least one of the optical distance d, the focal length f, the emission frequency F, and the movement speed V is changed in accordance with a change in the effective radius R, so as to satisfy a relation $2dr/f=nV/F$, where n is an integer.

3. A semiconductor device manufacturing method for producing a semiconductor device by use of an exposure apparatus as recited in claim 1 and from a second object as recited in claim 1.

4. A projection exposure method for transferring, by projection exposure using a plurality of pulse lights, a pattern of a first object onto a second object while moving the first and second objects in a scan direction, said method comprising the steps of:

producing pulse light from a light source;

forming a secondary light source by use of the pulse light from the light source; and placing a slit away from the first object or a plane being conjugate therewith, wherein the pulse light from the secondary light source passes through the slit and is projected onto the first object, by which a light intensity distribution of a trapezoidal shape with respect to the scan direction is produced on the first object, wherein, when R is an effective radius of the secondary light source, d is an optical distance from the slit to the first object or the plane conjugate therewith, f is a focal length of an optical member for projecting the pulse light from the secondary light source toward the slit, F is a pulse emission frequency of the light source, and V is a movement speed of the first object in the scan direction during the scan exposure thereof, at least one of the optical distance d, the focal length f, the emission frequency F, and the movement speed V is changed in accordance with a change in the effective radius R, so as to make uniform an integrated exposure amount distribution to be provided by plural pulse lights.

5. A method according to claim 4, wherein at least one of the optical distance d, the focal length f, the emission frequency F, and the movement speed V is changed in accordance with a change in the effective radius R, so as to satisfy a relation $2dr/f=nV/F$, where n is an integer.

6. A semiconductor device manufacturing method for producing a semiconductor device on the basis of an exposure method as recited in claim 4 and from a second object as recited in claim 4.

* * * * *

UNITED STATES PATENT AND TRADEMARK OFFICE
CERTIFICATE OF CORRECTION

PATENT NO. : 6,323,937 B1
DATED : November 27, 2001
INVENTOR(S) : Kazuo Sano

Page 1 of 1

It is certified that error appears in the above-identified patent and that said Letters Patent is hereby corrected as shown below:

Column 1
Line 40, "performed As" should read -- performed. As --

Column 2,
Line 8, "surface. Japanese" should read -- surface. ¶ Japanese --.
Line 13, "surface/to" should read -- surface, to --.
Line 31, "illuminated" should read -- illuminated. --.

Column 5,
Line 48, "integrator 3" should read -- integrator 3. --.
Line 53, "slit 9" should read -- slit 9. --.

Column 6,
Line 2, "hat" should read -- has --.
Line 29, "surface 3d" should read -- surface 3d. --
Line 54, "Isosceles" should read -- isosceles --.

Column 8,
Line 63, "can" should read -- scan --.

Column 9,
Line 32, "Scan" should read -- scan --.

Column 10,
Line 22, "for." should read -- for --.
Line 23, "water" should read -- wafer --.

Signed and Sealed this

Nineteenth Day of March, 2002

Attest:

*Attesting Officer*

JAMES E. ROGAN
*Director of the United States Patent and Trademark Office*